United States Patent [19]

Leonardi

[11] Patent Number: 4,884,012
[45] Date of Patent: Nov. 28, 1989

[54] VERTICAL DEFLECTION CURRENT GENERATOR

[75] Inventor: Giovanni M. Leonardi, Zurich, Switzerland

[73] Assignee: RCA Licensing Corporation, Princeton, N.J.

[21] Appl. No.: 206,780

[22] Filed: Jun. 15, 1988

[51] Int. Cl.[4] .......................... H01J 29/70; H01J 29/76
[52] U.S. Cl. ...................................... 315/397; 315/408
[58] Field of Search ......................... 315/396, 397, 408

[56] References Cited

U.S. PATENT DOCUMENTS

| | | |
|---|---|---|
| 3,784,857 | 1/1974 | Christopher . |
| 3,979,641 | 9/1976 | Arakawa et al. . |
| 3,993,930 | 11/1976 | Fischman et al. . |
| 4,024,433 | 5/1977 | Korver . |
| 4,238,713 | 12/1980 | Moles . |
| 4,694,226 | 9/1987 | Wilber . |

OTHER PUBLICATIONS

Service Information for Monitors, Ref No. Mon 440-E of Barco Electronic NV, Belgium, the cover sheet dated Jun. 87.

Primary Examiner—Theodore M. Blum
Attorney, Agent, or Firm—Joseph S. Tripoli; Joseph J. Laks; Sammy S. Henig

[57] ABSTRACT

A vertical deflection current generator includes an operational amplifier responsive to an input sawtooth signal at a vertical rate. A first end terminal of a deflection winding is coupled to an output terminal of the amplifier. A second end terminal of the deflection winding is coupled in series with a parallel arrangement of a switch and a capacitor. The switch is conductive during vertical trace. During vertical retrace, the switch is nonconductive that causes a vertical retrace voltage to develop in a flyback manner in the retrace capacitor. The retrace voltage in the retrace capacitor and a retrace voltage at the output terminal of the amplifier that are opposite in phase speed up the reversal of a deflection current in the deflection winding.

13 Claims, 3 Drawing Sheets

VERTICAL DEFLECTION CURRENT GENERATOR

This application relates to a vertical deflection current generator of a television apparatus.

To provide vertical trace current to a vertical deflection winding, a conventional vertical deflection circuit at a standard field rate of, for example, 50 Hz in PAL, includes, for example, two output transistors forming a push-pull output stage. The output stage drives the deflection winding. During vertical retrace, the current in the deflection winding is reversed in direction to be ready for the next trace interval.

One prior art vertical deflection circuit operating at the standard vertical rate includes a retrace capacitor coupled to the deflection winding to form a resonant retrace circuit for generating a resonant retrace current. The retrace capacitor is coupled at a junction between the deflection winding and an output terminal of the output stage. During vertical retrace, the transistors of the output stage are switched off; therefore, the duration of vertical retrace interval is determined by the retrace voltage across the retrace capacitor.

The threshold of perception of field flicker in a television display system is a function of the flicker frequency and the brightness of the display. Over the years displays have increased in brightness to the point where flicker is noticeable even in relatively high field rate systems (e.g., the NTSC 60 Hz system) and clearly objectionable in lower field rate systems (e.g., the PAL 50 Hz system). A solution to this problem is to double the field rate of the deflection current causing the rate of displaying the images to double. Consequently, it may be desirable to shorten the vertical retrace interval in the vertical deflection current that is at double the field rate, relative to that in the typical generator that generates the deflection current at the standard field rate.

A vertical deflection current generator, embodying an aspect of the invention, includes an operational amplifier responsive to an input, sawtooth signal at double the standard vertical rate. A first end terminal of a deflection winding is coupled to an output terminal of the amplifier. A second end terminal of the deflection winding is coupled to a switch that is conductive during vertical trace. A retrace capacitor is coupled across the switch. During vertical retrace, the switch becomes nonconductive that causes vertical retrace voltage to develop in a flyback manner across the retrace capacitor. The retrace voltage across the retrace capacitor that is coupled to the second end terminal of the deflection winding, and a retrace voltage at the output terminal of the amplifier that is coupled to the first terminal, that are opposite in phase, speed up the reversal of the deflection current in the deflection winding. Speeding up of the retrace interval occurs because the resultant retrace voltage across the deflection winding is higher than the retrace voltage that would have been developed had only one retrace voltage been applied. In this way, the two oppositely phased retrace voltages, one produced at the output of the amplifier and the other across the retrace capacitor, are developed across the vertical deflection winding. The retrace voltages cause the rate of change of the vertical deflection current to be high during vertical retrace. The result is that the vertical retrace interval is shortened relative to that of a conventional vertical deflection generator that develops only one retrace voltage.

In a television deflection apparatus, embodying another aspect of the invention, a source of a sawtooth signal at a frequency that is related to a vertical deflection frequency is included. The apparatus includes a vertical deflection winding for conducting therein a deflection current. A retrace pulse voltage is generated at a second terminal. A sawtooth output voltage having a retrace pulse voltage portion that is oppositely directed to that retrace pulse voltage at a second terminal that is coupled to the deflection winding is generated. The deflection winding is interposed between the first and second terminals.

Figure 1:
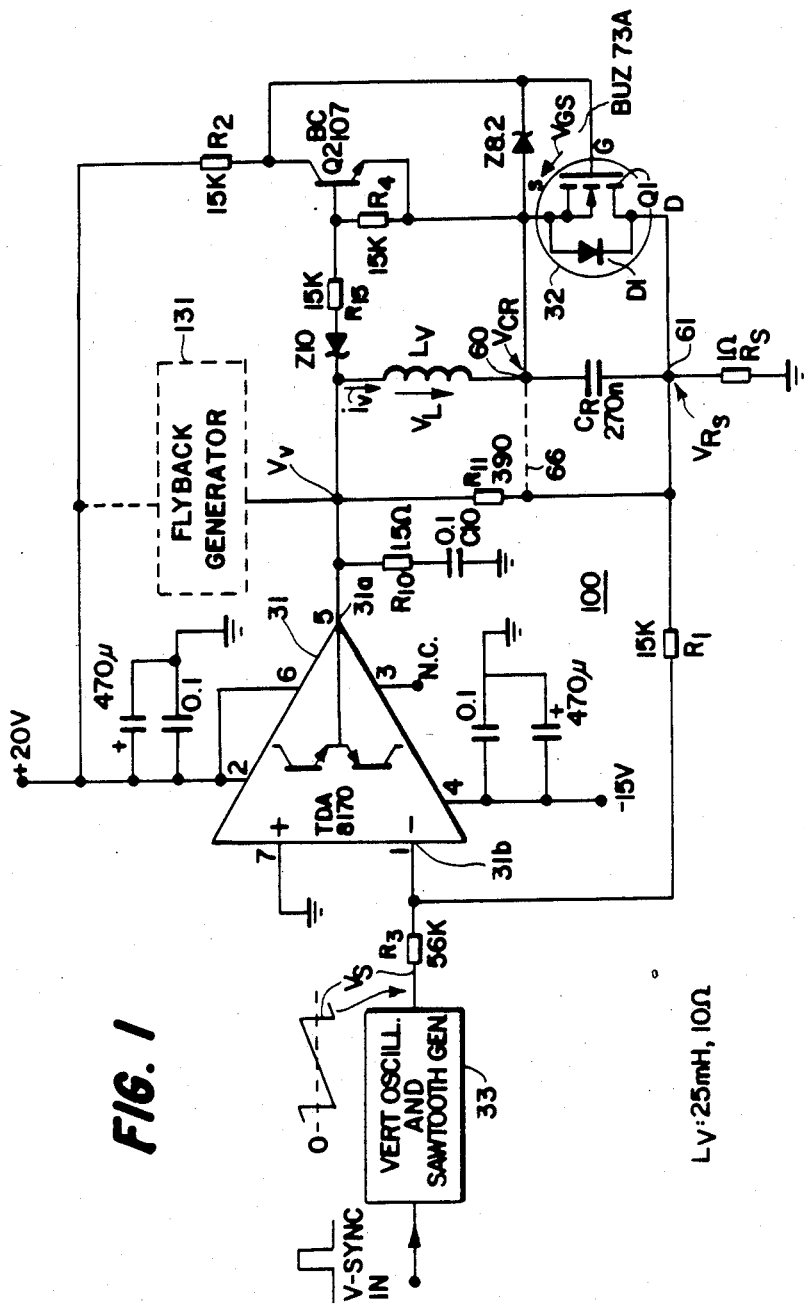
FIG. 1 illustrates a vertical deflection circuit, embodying an aspect of the invention.

FIG. 1 illustrates a vertical deflection circuit 100, embodying an aspect of the invention. Deflection circuit 100 includes an operational amplifier 31 utilizing integrated circuit (IC) technology having an inverting input terminal 31b that is responsive to a sawtooth signal $V_s$. Signal $V_s$ that is developed at a rate of, for example, 100 Hz, or twice the conventional field rate, is produced in a vertical oscillator and sawtooth generator 33 and coupled via a resistor $R_3$ to inverting input terminal 31b of amplifier 31. An output terminal 31a of amplifier 31 is coupled to one end terminal of a vertical deflection winding $L_y$. A second end terminal of winding $L_y$ is coupled via a junction terminal 60 to a first terminal of a vertical retrace capacitor $C_R$ and to a main current conducting terminal of a switching arrangement 32. Switching arrangement 32 includes, for example, a MOSFET transistor Q1 and a diode D1 that is coupled in parallel with transistor Q1. Switching arrangement 32, is coupled in parallel with capacitor $C_R$, and has a second main current conducting terminal that is coupled to a junction terminal 61. A vertical current sampling resistor $R_s$ is coupled between terminal 61 and ground. A negative feedback providing resistor $R_1$ has one end terminal that is coupled to terminal 61 and a second end terminal that is coupled to inverting input terminal 31b of amplifier 31.

A cathode electrode of a 10 volt zener diode Z10 is coupled to output terminal 31a of amplifier 31. The anode electrode of zener diode 10 is coupled via a resistor $R_{15}$ to a base electrode of a switching transistor Q2. The collector electrode of transistor Q2 is coupled through a load resistor $R_2$ to a supply voltage of, for example, +20 volts that also energizes amplifier 31. The collector electrode of transistor Q2 is coupled to a gate electrode of transistor Q1 of arrangement 32 for controlling the switching operation of transistor Q1. Transistor Q2 causes transistor Q1 to be conductive during vertical trace, as described later on. Transistor Q2 causes transistor Q1 to become nonconductive during vertical retrace. A flyback retrace pulse voltage VCR, embodying a feature of the invention, is developed across capacitor CR when switching arrangement 32 is nonconductive. Resistors $R_{10}$ and $R_{11}$ and a capacitor $C_{10}$ provide oscillation damping during trace.

FIGS. 2a–2g illustrate waveforms useful in explaining the operation of the circuit of FIG. 1. Similar symbols and numerals in FIGS. 1 and 2a–2g indicate similar items or functions.

Figure 2:
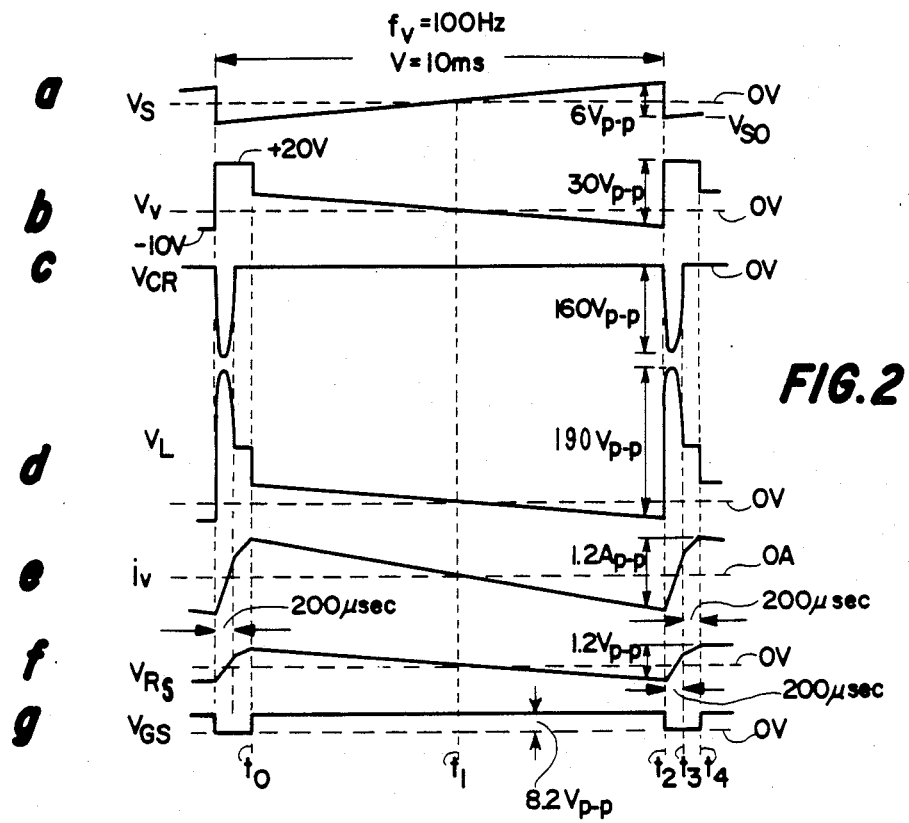
FIGS. 2a–2g illustrates waveforms useful in explaining the operation of the circuit of FIG. 1.

Throughout an interval $t_0$–$t_2$ of FIG. 2b, representing vertical trace, a voltage $V_v$, at output terminal 31a of amplifier 31 of FIG. 1 is less positive than +10 volts. Therefore, zener diode Z10 is nonconductive, causing transistor Q2 to be nonconductive. When transistor Q2 is nonconductive, it causes a gate-source voltage of transistor Q1, that is clamped to 8.2 volts by an 8.2 volt zener diode Z8.2, to be higher than the turn-on threshold voltage of transistor Q1. Therefore, during vertical trace, transistor Q1 is turned-on. A resistor $R_4$ prevents a base electrode voltage of transistor Q2 from becoming lower than 6 volts during vertical trace.

During a portion $t_0$–$t_1$, representing the first half of the trace interval of FIG. 2e, a positive current $i_v$ flows through winding $L_V$ and diode D1 of switching arrangement 32 of FIG. 1. Between time $t_1$ and $t_2$ of FIG. 2e, forming the second half of vertical trace, negative current $i_V$ flows through winding $L_V$ and through MOS power transistor Q1 of FIG. 1. Therefore, throughout vertical trace, capacitor $C_R$ is short-circuited or by-passed. At time $t_2$ of FIG. 2a, at the end of trace and at the beginning of vertical retrace, voltage $V_s$ produced by generator 33 of FIG. 1 reverses its direction. Therefore, voltage $V_s$ is established at a level $V_{so}$ of FIG. 2a. Consequently, amplifier 31 of FIG. 1 causes output retrace voltage 1′ to be at the maximum positive level that can be supplied from terminal 31a and that is about +20 volts. It follows that, during vertical retrace, between times $t_2$ and $t_3$ of FIG. 2b, zener diode 10 of FIG. 1 is conducting and transistor Q2 is in saturation that causes transistor Q1 to be in cut-off.

Since current $i_v$ of FIG. 2e is negative at time $t_2$, the beginning of retrace, diode D1 of switching arrangement 32 of FIG. 1 is back-biased. Therefore, after time $t_2$ of FIG. 2c, capacitor $C_R$ of FIG. 1 forms with winding $L_V$ a resonant circuit, tuned to about 2.5 kHz that generates a resonant, negative retrace pulse voltage VCR of FIG. 2c at terminal 60 of winding $L_V$ of FIG. 1. Pulse voltage $V_R$ continues until time $t_3$ of FIG. 2c within retrace. From time $t_2$ to time $t_4$ of FIG. 2b, voltage at output terminal 31a of amplifier 31 of FIG. 1 remains at a high level of approximately 20 volts. That high level of voltage v is determined by the +20 volt power supply that energizes amplifier 31.

In accordance with an aspect of the invention, each of voltages $V_v$ and $V_{CR}$ are oppositely directed, during at least a portion of retrace. At the end of trace, each changes relative to its corresponding level during trace, to a level that tends to reverse the direction of deflection current in after the end of trace. Thus, the retrace portion of voltage $V_v$ and retrace pulse $V_{CR}$ that are at opposite polarities have cumulative effects that speed up the reversal of deflection current $i_v$ during retrace.

The effective retrace time is the sum of interval $t_2$–$t_3$ of FIG. 2c that is about 200 microseconds and interval $t_3$–$t_4$ that is about 200 microseconds. In contrast, a conventional vertical deflection circuit, where terminals 60 and 61 are at the same potential, as shown by jumper wire 66 in dashed lines, would typically have an effective retrace time of 100 microseconds.

If a vertical deflection winding having high power losses is used, then, a conventional flyback pulse generator 131, shown in dash lines, may be employed to form retrace pulse voltage $V_y$ at terminal 31a. This enables voltage $V_y$ to be more positive than the maximum positive voltage provided by amplifier 31 as limited by the +20 volt supply voltage. The higher retrace pulse further reduces the retrace interval.

Because of retrace voltage $V_{CR}$ that reduces the retrace interval, the peak positive voltage at terminal 31a may be lower than if retrace voltage $V_{CR}$ were not used. Therefore, voltage stress at terminal 31a on output transistors of amplifier 31 is, advantageously, reduced.

Figure 3:
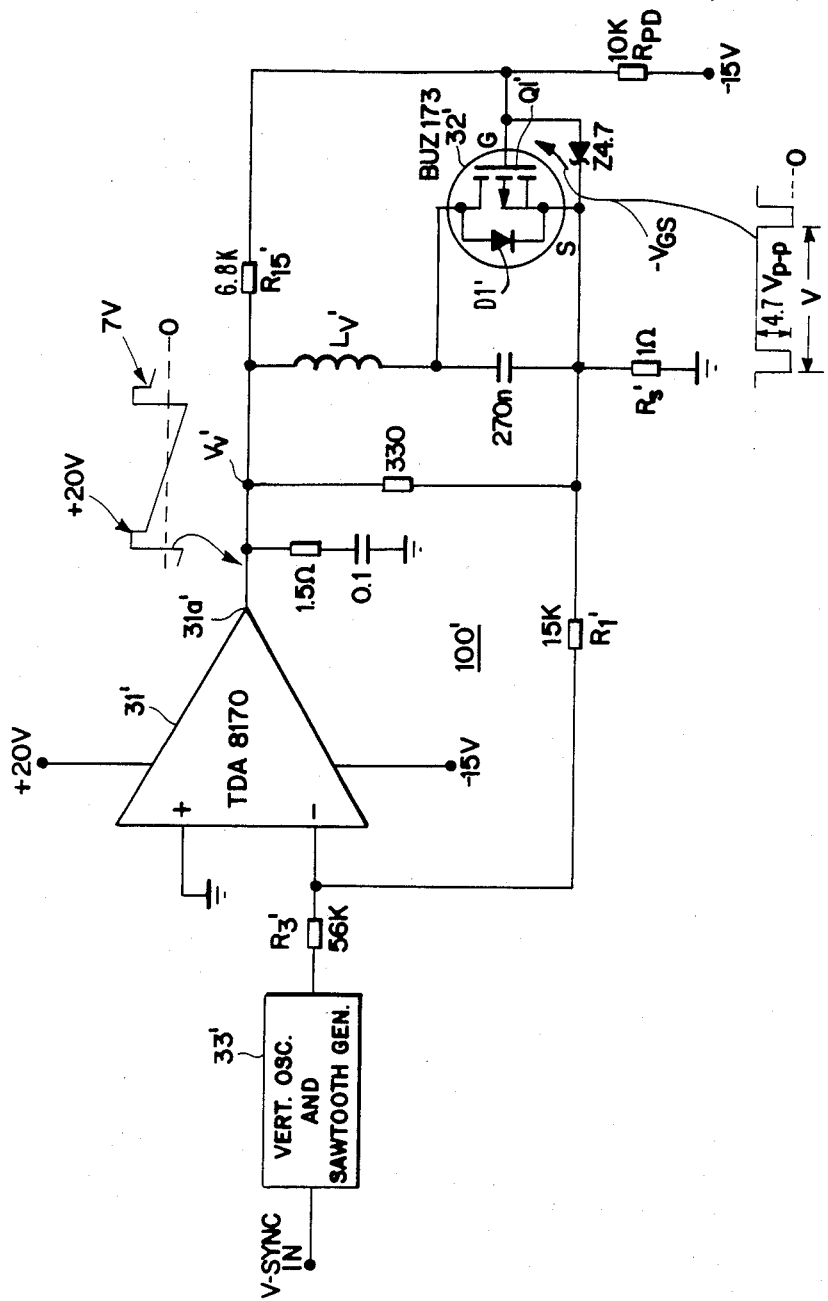
FIG. 3 illustrates a second embodiment of the invention.

FIG. 3 illustrates a second embodiment of the invention in which switch 32′ utilizes a P-channel type power MOS-FET. Similar numbers and symbols in FIG. 1 and 3 indicate similar items or functions. In the circuit of FIG. 3, the control circuit of the gate is, advantageously, simpler than in FIG. 1. The control circuit includes a resistor $R_{15}'$ that couples voltage $V_{y'}$ at terminal 31a′ to a gate electrode of a P-channel type transistor Q1′. A resistor $R_{PD}$ that is coupled between the gate electrode and a negative power supply voltage causes a 4.7 volt zener diode 4.7 that is coupled between the gate and source electrodes of transistor Q1′ to operate in its avalanche mode during trace. The result is that, during trace, transistor Q1′ is turned-on. During retrace, retrace voltage $V_{y'}$ causes transistor Q1′ to turn off.

Figure 4A:
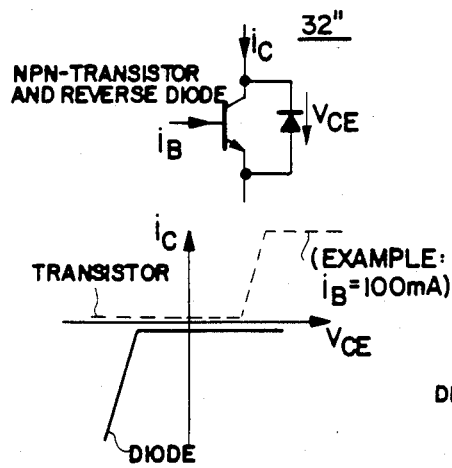
FIGS. 4a and 4b illustrate the characteristics of a bipolar transistor and of an MOS FET, respectively, that may be used to perform switching operation in the circuit of FIG. 1.
Figure 4B:
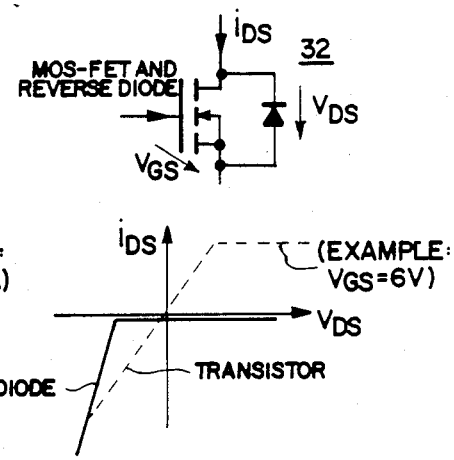

It should be understood that the use of P—N—P or N—P—N bipolar transistors with reverse diode to form switching arrangement 32″, as shown in FIG. 4a, is also possible. However, this may cause linearity errors in the center of the CRT screen, not shown in the figures, in the crossover region of the transistor and diode. In contrast, as shown in FIG. 4b, MOS-FET of switching arrangement 32 of FIG. 1 exhibits better linearity in the crossover region.

What is claimed:

1. A television vertical deflection apparatus, comprising:

a source of an input signal at a frequency that is related to a deflection frequency;

a vertical deflection winding having a pair of terminals;

a vertical deflection circuit output stage responsive to said input signal and coupled to one of said pair of terminals for developing at said one terminal an output voltage that produces a deflection current in said deflection winding, said output voltage including a retrace pulse portion that produces a corresponding retrace portion of said deflection current during a retrace interval and a trace portion that produces a corresponding trace portion of said deflection current during a trace interval;

a retrace capacitance coupled to the other one of said pair of terminals; and switching means coupled to a junction terminal between said retrace capacitance and said other one of said pair of terminals of said deflection winding for conducting said trace portion of said deflection current in a manner that bypasses said retrace capacitance during said trace interval when said switching means is at a first state, and for enabling said retrace portion of said deflection current to flow in said retrace capacitance when said switching means is at a second state for developing a resonant retrace pulse at the other one terminal of said deflection winding such that said retrace pulse portion of said output voltage and said resonant retrace pulse are oppositely directed pulses during at least a portion of said retrace interval to provide a rapid retrace of said deflection current.

2. An apparatus according to claim 1 wherein said switching means is coupled in parallel with said retrace capacitance to form a parallel arrangement, that maintains said retrace capacitance discharged during said trace portion of said deflection current.

3. An apparatus according to claim 2 wherein said parallel arrangement is coupled in series with said deflection winding such that said deflection winding is interposed between said output stage and said parallel arrangement.

4. An apparatus according to claim 1 further comprising, means coupled to said deflection winding for generating a feedback signal that is representative of said trace portion of said deflection current and means responsive to said input signal for generating a sawtooth signal, wherein said output stage comprises an output amplifier responsive to said sawtooth and feedback signals for generating said output voltage in accordance with a difference therebetween.

5. An apparatus according to claim 4 wherein a peak level of said retrace pulse portion of said output voltage is limited by a level of a supply voltage that energizes said amplifier.

6. An apparatus according to claim 4 wherein said switching means is coupled in parallel with said retrace capacitance to form a parallel arrangement that is coupled in series with said deflection winding and with said feedback signal generating means.

7. An apparatus according to claim 4 wherein said feedback signal generating means comprises a sampling resistance that is coupled in series with said deflection winding.

8. An apparatus according to claim 1 wherein said switching means has a control terminal that is coupled between said one terminal of said deflection winding and said output stage.

9. An apparatus according to claim 1 wherein said switching means comprises an FET transistor and a diode that are coupled in parallel.

10. An apparatus according to claim 1 wherein said output stage comprises a pair of transistors that form a push-pull output amplifier such that said one terminal of said deflection winding is coupled at a junction terminal between said transistors.

11. An apparatus according to claim 10 wherein said output stage further comprises means responsive to said input signal for generating said retrace pulse portion at a magnitude that is higher than a power supply voltage that energizes said pair of transistors.

12. A television vertical deflection apparatus, comprising;
a source of a sawtooth signal at a frequency that is related to a vertical deflection frequency;
a vertical deflection winding for conducting therein a deflection current;
means responsive to said sawtooth signal for generating a first retrace pulse voltage at a first terminal; and
means responsive to said sawtooth signal for generating at a second terminal a sawtooth output voltage having a retrace pulse voltage portion that is oppositely directed to that of said first retrace pulse voltage and that is coupled to said deflection winding such that said deflection winding is interposed between said first and second terminals.

13. An apparatus according to claim 12 wherein said first retrace pulse voltage generating means comprises a controllable switch that is conductive throughout a trace interval and that is nonconductive at least during a portion of a retrace interval and a retrace capacitance that forms a parallel arrangement with said switch, said parallel arrangement being coupled in series with said deflection winding such that during said trace interval said deflection current bypasses said capacitance and flows in said switch and during at least said portion of said retrace interval said deflection current bypasses said switch and flows in said retrace capacitance for developing therein said first retrace pulse voltage to speed up a reversal of said deflection current.

* * * * *